(12) United States Patent
Welser et al.

(10) Patent No.: US 9,543,456 B1
(45) Date of Patent: Jan. 10, 2017

(54) MULTIJUNCTION SOLAR CELL EMPLOYING EXTENDED HETEROJUNCTION AND STEP GRADED ANTIREFLECTION STRUCTURES AND METHODS FOR CONSTRUCTING THE SAME

(71) Applicant: Magnolia Solar, Inc., Woburn, MA (US)

(72) Inventors: Roger E. Welser, Providence, RI (US); Ashok K. Sood, Brookline, MA (US)

(73) Assignee: Magnolia Solar, Inc., Woburn, MA (US)

( * ) Notice: Subject to any disclaimer, the term of this patent is extended or adjusted under 35 U.S.C. 154(b) by 0 days.

(21) Appl. No.: 14/547,055

(22) Filed: Nov. 18, 2014

Related U.S. Application Data

(63) Continuation of application No. 12/719,811, filed on Mar. 8, 2010, now Pat. No. 8,895,838.

(60) Provisional application No. 61/293,469, filed on Jan. 8, 2010.

(51) Int. Cl.
| | | |
|---|---|---|
| H01L 31/00 | (2006.01) |
| H01L 31/0216 | (2014.01) |
| H01L 31/0725 | (2012.01) |
| H01L 31/0735 | (2012.01) |
| H01L 31/18 | (2006.01) |

(52) U.S. Cl.
CPC ..... *H01L 31/02168* (2013.01); *H01L 31/0725* (2013.01); *H01L 31/0735* (2013.01); *H01L 31/184* (2013.01); *H01L 31/1844* (2013.01)

(58) Field of Classification Search
None
See application file for complete search history.

(56) References Cited

U.S. PATENT DOCUMENTS

| 4,583,822 A | 4/1986 | Southwell |
| 5,496,415 A | 3/1996 | Barnham |
| 7,202,411 B1 | 4/2007 | Wernsman |

(Continued)

FOREIGN PATENT DOCUMENTS

EP 1100168 A1 5/2001

OTHER PUBLICATIONS

Alemu, et al., "Dependence of Device Performance on Carrier Escape Sequence in Multi-quantum-Well p-i-n Solar Cells", "Journal of Applied Physics", May 4, 2006, pp. 084506-1-084506-5, vol. 99, No. 084506, Publisher: American Institute of Physics, Published in: US.

(Continued)

*Primary Examiner* — Eli Mekhlin
(74) *Attorney, Agent, or Firm* — Loginov & Associates, PLLC; William A. Loginov

(57) ABSTRACT

Material and antireflection structure designs and methods of manufacturing are provided that produce efficient photovoltaic power conversion from single- and multi-junction devices. Materials of different energy gap are combined in the depletion region of at least one of the semiconductor junctions. Higher energy gap layers are positioned to reduce the diode dark current and enhance the operating voltage by suppressing both carrier injections across the junction and recombination rates within the junction. Step-graded antireflection structures are placed above the active region of the device in order to increase the photocurrent.

1 Claim, 8 Drawing Sheets

(56) References Cited

U.S. PATENT DOCUMENTS

| | | |
|---|---|---|
| 7,483,212 B2 | 1/2009 | Cho et al. |
| 7,553,691 B2 | 6/2009 | Fatemi et al. |
| 2004/0187912 A1* | 9/2004 | Takamoto ......... H01L 31/03046 136/255 |
| 2007/0137695 A1 | 6/2007 | Fetzer et al. |
| 2010/0006143 A1 | 1/2010 | Welser |
| 2010/0096010 A1 | 4/2010 | Welser |

OTHER PUBLICATIONS

Kim, et al., "GaInN Light-Emitting Diode With Conductive Omni-directional Reflector Having a Low-Refractive-Index Indium-Tin Oxide Laye", "Applied Physics Letters", Jan. 3, 2006, pp. 013501-1-013501-3, vol. 88, No. 013501, Publisher: American Institute of Physics.

Mochizuki, et al., "GaInP/GaAs Collector-Up Tunneling-Collector Heterojunction Bipolar Transistors (C-Up TC-HBTS): Optimization of Fabricat", "Transactions on Electron Devices", Dec. 2000, pp. 2277-2283, vol. 47, No. 12, Publisher: IEEE, Published in: US.

Asbeck, et al., "Heterojunction Bipolar Transistor Technology", "Introduction to Semiconductor Technology: GaAs and Related Compounds", May 1990, pp. 170; 179-187; 195-203, Publisher: John Wiley & Sons, Published in: US.

Henry, "Limiting Efficiencies of Ideal Single and Multiple Energy Gap Terrestrial Solar Cells", "Journal of Applied Physics", Apr. 9, 1980, pp. 4494-4500, vol. 51, No. 8, Publisher: American Institute of Physics, Published in: US.

Torchynska, et al., "III-V Material Solar Cells for Space Application", "Semiconductor Physics, Quantum Electronics & Optoelectronics", 2002, pp. 63-70, vol. 5, No. 1, Publisher: Institute of Semiconduct Physics, National Academy of Sciences of Ukraine, Published in: UA.

Matheu, et al., "Metal and Dielectric Nanoparticle Scattering for Improved Optical Absorption in Photovoltaic Devices", "Applied Physics Letters", Sep. 18, 2008, pp. 113108-1-113108-3, vol. 93, No. 113108, Publisher: American Institute of Physics, Published in: US.

Xi, et al., "Optical Thin-Film Materials With Low Refractive Index for Broadband Elimination of Fresnel Reflection", "Letters", Mar. 2007, pp. 176-179, vol. 1, Publisher: Nature Publishing Group.

Bosi, et al., "The Potential of III-V Semiconductors as Terrestrial Photovoltaic Devices", "Progress in Photovoltaics: Research and Applications", Jun. 19, 2006, pp. 51-68, vol. 15, Publisher: John Wiley & Sons, Ltd., Published in: US.

Dodd, et al., "Surface and Perimeter Recombination in GaAs Diodes: An Experimental and Theoretical Investigation", "Transactions on Electron Devices", Jun. 1991, pp. 1253-1261, vol. 38, No. 6, Publisher: IEEE, Published in: US.

Wei, et al., "Thermodynamic Limits of Quantum Photovoltaic Cell Efficiency", "Applied Physics Letters", 2007, pp. 223507-1-223507-3, vol. 91, No. 223507, Publisher: American Institute of Physics, Published in: US.

* cited by examiner

MULTIJUNCTION SOLAR CELL EMPLOYING EXTENDED HETEROJUNCTION AND STEP GRADED ANTIREFLECTION STRUCTURES AND METHODS FOR CONSTRUCTING THE SAME

RELATED APPLICATIONS

This application is a continuation of U.S. patent application Ser. No. 12/719,811, filed Mar. 8, 2010, entitled MULTIJUNCTION SOLAR CELL EMPLOYING EXTENDED HETEROJUNCTION AND STEP GRADED ANTIREFLECTION STRUCTURES AND METHODS FOR CONSTRUCTING THE SAME, now U.S. Pat. No. 8,895,838, which claims the benefit of U.S. Provisional Patent Application Ser. No. 61/293,469, filed on Jan. 8, 2010, entitled EFFICIENT SOLAR CELL EMPLOYING MULTIPLE ENERGY-GAP LAYERS AND LIGHT-SCATTERING STRUCTURES AND METHODS FOR CONSTRUCTING THE SAME, the entire disclosure of each of which applications is expressly incorporated herein by reference.

FIELD OF THE INVENTION

This invention relates to semiconductor-based photovoltaic energy converters, also known as "solar cells," and to the design and fabrication of the same.

BACKGROUND OF THE INVENTION

With appropriate electrical loading, photovoltaic solid state semiconductor devices, commonly known as solar cells, covert sunlight into electrical power by generating both a current and a voltage upon illumination. The current source in a solar cell is the charge carriers that are created by the absorption of photons. These photogenerated carriers are typically separated and collected by the use of PN or PIN junctions in semiconductor materials. The operational voltage of photovoltaic devices is limited by the dark current characteristics of the underlying PN or PIN junction(s). Thus improving the power output performance of any solid state solar cell generally entails simultaneously maximizing absorption and carrier collection while minimizing dark diode current.

Detailed balance calculations are typically used to compute the ideal, limiting performance of semiconductor solar cell devices (see for example, C. H. Henry, *Limiting Efficiencies of Ideal Single and Multiple Energy-gap Terrestrial Solar Cells*, J. Appl. Phys., vol. 51, pp. 4494-4500, August 1980). Two fundamental assumptions are traditionally made in these theoretical calculations. First, it is assumed that the diode dark current is limited by radiative recombination, and that the radiative recombination rate is set by the energy gap of the semiconductor material used to fabricate the device. Second, all of the photons in the incident spectrum with energy above the energy gap of the device material are assumed to create a charge carrier pair that is successfully separated and collected. In practice, neither of these assumptions is achieved. The dark current, and thus the operating voltage, of single junction homojunction solar cells and subcells are typically limited by non-radiative recombination mechanisms such as space charge recombination and majority carrier injection. Non-radiative recombination processes along with reflection losses also limit the current generating capability of single junction devices. Thus practical single junction solar cells have yet to reach the performance levels predicted by detailed balance calculations.

In recent years, multijunction solar cell structures have broken the Shockley-Queisser limit on solar cell performance derived from detailed balance calculations. Multijunction structures employ several different energy-gap materials, typically in separate PN junctions combined within a monolithic III-V material structure. Compared to state-of-the-art single junction GaAs solar cells, two- and three-junction III-V solar cells have roughly one half the current output, but benefit from a greatly increased voltage, which can be a factor of 2.5 to 3× higher, depending on the number junctions used and the individual properties of each junction subcell.

Even with the record breaking efficiency achieved with III-V multijunction solar cells, there remains keen interest in further improving the power output of these devices for both space and terrestrial applications. Therefore, it is desirable to provide for designs that can effectively suppress dark currents in each of the individual junction subcells employed in multijunction devices. Moreover, it is also desirable to provide design strategies and processes that can maximize the photocurrent generating capability of the limiting subcell within each multijunction structure.

SUMMARY OF THE INVENTION

This invention overcomes the disadvantages of the prior art by providing a multijunction solar cell structure and method of manufacturing that includes two design elements that separately, or in combination, can increase the power output of semiconductor solar cells. When fully functionalized, an illustrative embodiment combines the two sets of design elements together to increase both the voltage and current output of multijunction solar cells. Moreover, this invention provides enhancements to both the voltage and current generating capability of the III-V multijunction photovoltaic devices.

The first design element relates to the material structure of the active region of one or more of the subcells within a multijunction device where photo-generated carriers are created and separated. Notably, the basic active region structure of at least one of the subcells consists of a PN or PIN junction which contains materials of different energy gap within the junction depletion region. Moreover, a novel feature of the design is the positioning of the different energy gap material within the active region. In an illustrative embodiment, a wider energy gap barrier layer is positioned within the depletion region adjoining the emitter layer in order to suppress carrier injection across the junction. In addition, wider energy gap material can be located within the depletion region in the zone of enhanced space charge recombination, where the injected electron and hole concentrations are comparable. In an illustrative embodiment, the subcell structure positions at least one of the transitions from the narrowest energy gap material in active region to a wider energy gap material so that that it remains within the depletion region over a wide range of bias levels, even at forward bias levels appropriate for photovoltaic power generation.

The second design element relates to the application of antireflection layers above the active region of the device. The purpose of these antireflection structures is to maximize the number of incident photons that are directed into the device active region. In particular, multiple layers of material with index of refraction intermediate between that of the top subcell material and air can be formed on the top most device surface facing the sun. These lower index of refraction layers can consist of both epitaxial semiconductor material and optical thin film material. The exact thickness and index of refraction of the layer in the antireflection structure can be adjusted to minimize reflection losses over a broad spectrum of photon wavelengths and angles of incidence.

Illustratively, efficient photovoltaic devices both maximize the creation and collection of photo-generated carriers and enhance the voltage at which photo-generated carriers are extracted.

In an illustrative embodiment, a junction solar cell device defining a subcell-based construction with one or more subcells comprises at least one subcell containing an extended heterojunction. The heterojunction structures defines a semiconductor PN or PIN junction having an emitter and a base, in which the emitter consists of a material with a higher energy gap than an energy gap of a material that defines the base. An extended heterojunction structure also comprises at least one layer located in a depletion region adjacent to the emitter. Such layer includes a material with a higher energy gap than the energy gap of the material that defines the base.

In another illustrative embodiment, a junction solar cell device defining a subcell-based construction with one or more subcells comprises a broadband, step-graded antireflection structure located above the topmost subcell. The construction can further include epitaxial semiconductor layers constructed and arranged to reduce the index of refraction at a top surface of the solar cell device.

In another illustrative embodiment, a method of manufacturing a multijunction solar cell provides a subcell-based structure having a topmost subcell. A step-graded antireflection structure is deposited on a top of the topmost subcell. The subcell can include an extended heterojunction, defined as a semiconductor PN or PIN junction having an emitter and a base, in which the emitter and a layer located in a depletion region adjacent to the emitter consists of a material with a higher energy gap than an energy gap of a material that defines the base. The method can also further comprise varying an index of refraction of the anti-reflection structure by controlling a thickness and a composition of top epitaxial semiconductor layers and by depositing multiple layers of $TiO_2$- and $SiO_2$-based optical coatings. Additionally, the method can include forming a top optical coating structure by co-sputtering and oblique angle deposition adjacent to the top of the topmost subcell. The method can also include, first depositing buffer layers on a Ge substrate and next epitaxially growing in order (a) a GaAs-based lower subcell with an extended heterojunction; (b) a tunnel junction structure; (c) a top InGaP-based subcell with an extended heterojunction; and (d) a top GaAs contact layer; graded refractive index layer, after selective removal of the GaAs contact layer and the application of metallic contacts and gridlines. Likewise, the method can comprise (a) growing an epitaxial structure inverted on a GaAs substrate; then (b) removing epitaxial layers; (c) forming metallic contacts and gridlines; and (d) depositing a graded refractive index antireflection coating thereover.

BRIEF DESCRIPTION OF THE DRAWINGS

The invention will be readily understood by the following detailed description in conjunction with the accompanying drawings, wherein like reference numerals designate like structural elements, and in which.

The drawings are not necessarily to scale, emphasis instead being placed upon illustrating embodiments of the present invention.

DETAILED DESCRIPTION

Figure 1:
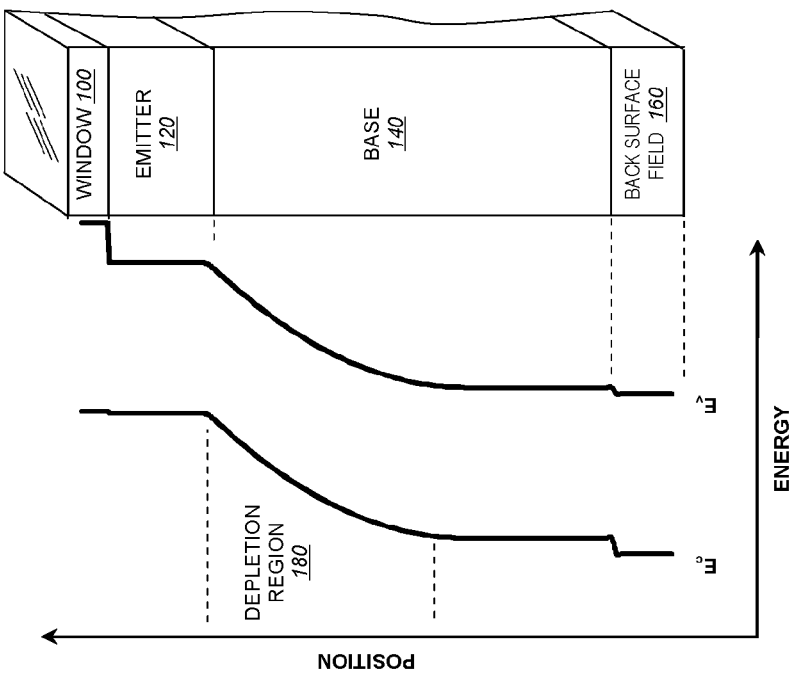
FIG. 1 is a diagram of the semiconductor energy band versus position for the material structure of a conventional homojunction solar cell according to a prior art arrangement.

FIG. 1 details a conventional arrangement for an epitaxial subcell in a typical III-V multijunction solar cell consisting of a top window 100, an emitter 120, base 140, and back surface field layer 160. As in any PN or PIN semiconductor junction, a depletion region 180 of high electric field forms between the emitter and base layers. The window 100 and back surface field 160 layers are designed to both confine photogenerated carriers and maximize optical transmission into underlying layers. In a conventional homojunction subcell, the energy gap of emitter 120 and base 140 materials is identical, and thus the depletion region consists of a single type of semiconductor material. The depicted layers in this structure, and other layered structures depicted herein, are aligned with associated graphs of energy versus position (depth) so as to provide further understanding of the performance of the structure.

Figure 2:
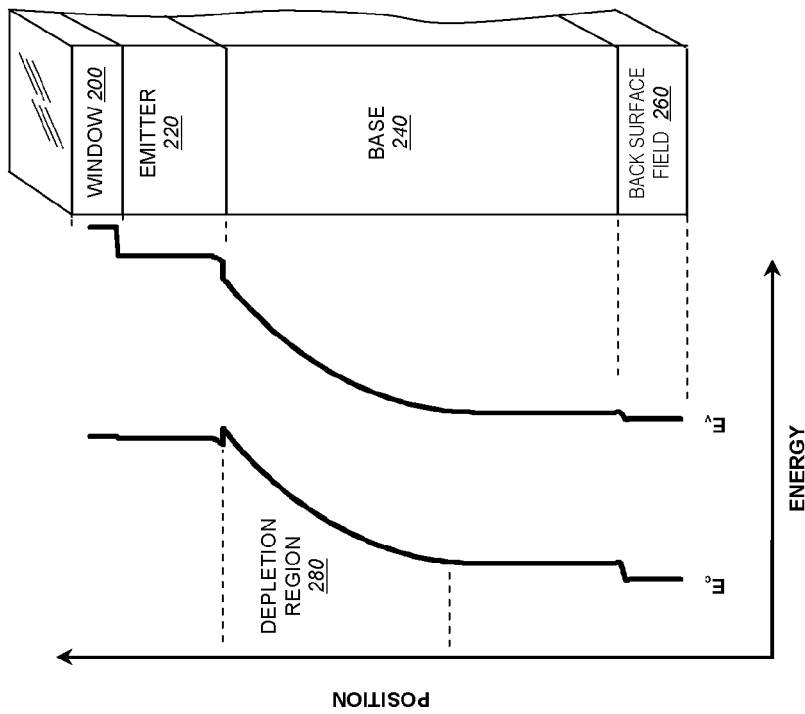
FIG. 2 is a diagram of the semiconductor energy band versus position for the material structure of a heterojunction solar cell according to a prior art arrangement.

Replacing the emitter layer with a higher energy gap material and thus forming a heterojunction subcell, as depicted in FIG. 2, can provide various benefits for multi-junction photovoltaic devices, as has been taught by, for example, Fatemi et al., U.S. Pat. No. 7,553,691. Theories may vary with respect to the physical principals that govern, but in general, the larger emitter 220 energy gap can reduce the diffusion-driven injection of majority carriers from the base 240 into the emitter 220. However, other significant diode dark current components, such as space charge recombination within the depletion region and carrier injection from the emitter 220 into the base 240, are not significantly improved with a standard heterojunction design. The physical boundary between higher energy gap and lower energy gap material in prior art heterojunction subcells, as depicted in FIG. 2, also corresponds to the physical boundary between n-doped to p-doped semiconductor materials.

Figure 4:
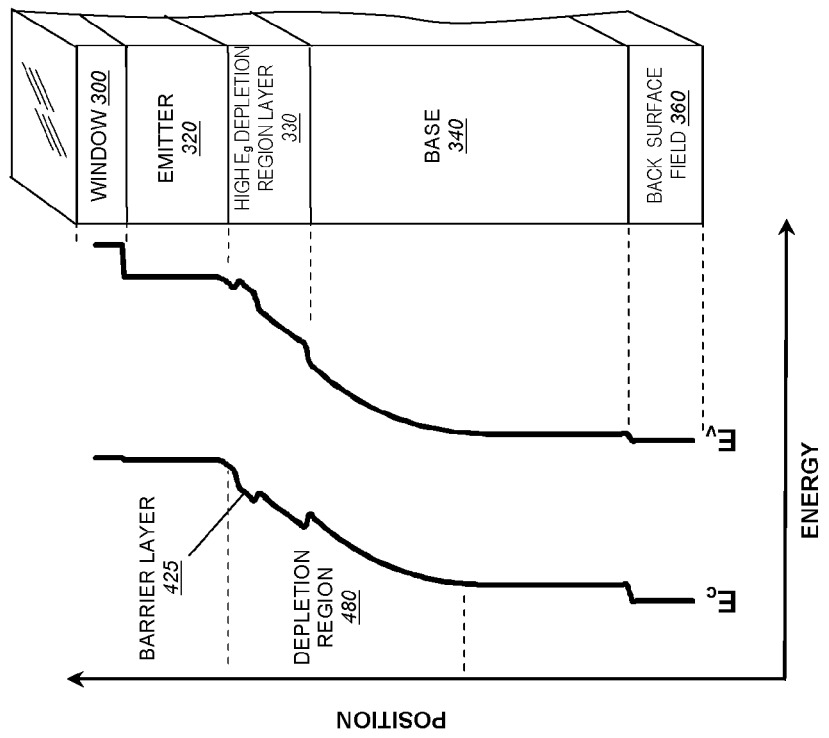
FIG. 4 is a diagram of the semiconductor energy band versus position for a material structure illustrating an extended heterojunction solar cell with a barrier layer which can further minimize diode dark current.
Figure 3:
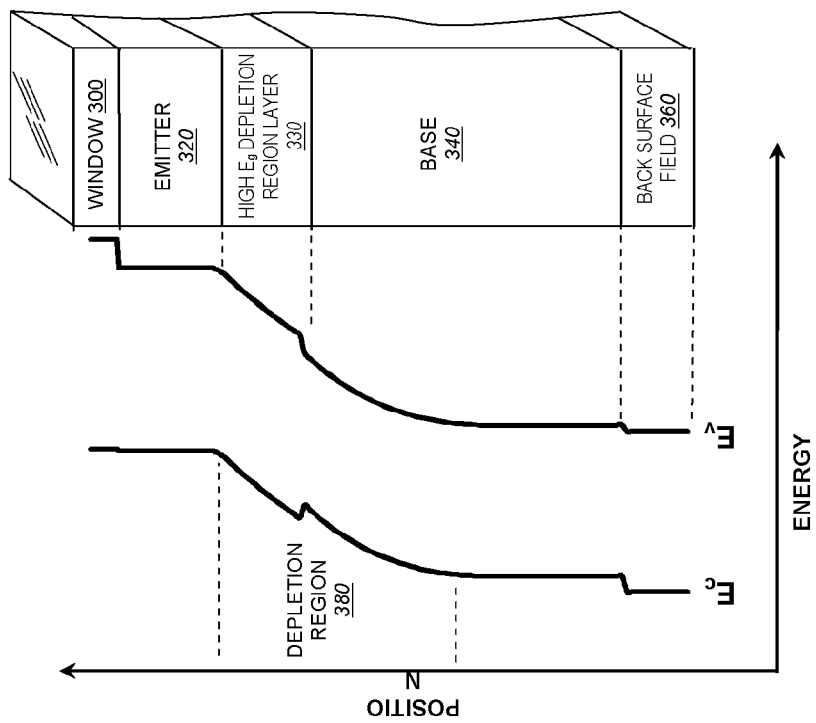
FIG. 3 is a diagram of the semiconductor energy band versus position for a material structure illustrating an extended heterojunction solar cell which can minimize diode dark current.

The layered structures and associated energy band graphs depicted in FIGS. 3 and 4, which are simplified for ease of understanding, illustrate the essential elements of a material structure that can suppress the dark current of a photovoltaic device. The basic material structure consists of a PN junction (depicted in alignment to the side of the graph, and representing the physical layered material), with an emitter 320/420, a base 340/440, and a depletion region 380/480. The depletion region 380/480 is distinguished by the presence of a built-in electric field, illustrated in FIGS. 3 and 4 by a non-zero slope in the conduction ($E_c$) and valence bands ($E_v$), induced by the juxtaposition of p-type and n-type semiconductor material. The thickness of the depletion region can be increased by heavily doping one side of the junction (the emitter in FIGS. 3 and 4), and by adding unintentionally doped material between the p-type and n-type material, forming what is commonly referred to as a PIN junction. As with many typical solar cell designs, window 300/400 and back surface field 360/460 layers can be included above and below the PN junction. Illustratively, photo-generated minority carrier holes in the emitter 320/420 and base 340/440 adjacent to the depletion region 380/480 diffuse to the depletion region in the structure depicted in FIGS. 3 and 4. However, compositionally graded emitter 320/420 and base 340/440 material can be employed as well in an alternate embodiment (not shown), the implementation of which should be clear to those of skill in the art.

The arrangement of the depletion region 380/480 incorporates several novel features in accordance with illustrative embodiments contemplated herein. First, higher energy gap material is inserted into the depletion region 380/480 adjacent to the emitter 320/420 to form a higher energy gap ($E_g$) depletion region layer 330/430. In contrast to prior art, the physical boundary between the different energy gap materials is offset from the physical boundary between the n- and p-type materials. In one embodiment, depicted in FIG. 3, the higher energy gap depletion region layer 330 is a single material composition matching that of the emitter 320, but is either undoped or with a dopant type matching the base to ensure that this higher energy gap layer lies entirely within the depletion region. In another embodiment, depicted in FIG. 4, the higher energy gap depletion region layer 430 consists of several different material compositions. In particular, a barrier layer 425 is placed within the high energy gap depletion region layer 430 close to the emitter 420. The purpose of the barrier layer 425 is to provide a barrier to the diffusion of majority carriers out of the emitter 420.

By way of further background, for photovoltaic applications, energy-gap differences at heterointerfaces within the device structure can act as unwanted barriers to the extraction of photo-generated carriers. However, field-assisted thermionic emission and tunneling are well-established mechanisms by which carriers can escape from a potential well (see for example, by way of useful background information, A. Alemu, J. A. H. Coaquira, and A. Freundlich, *Dependence of Device Performance on Carrier Escape Sequence in Multi-Quantum-Well p-i-n Solar Cells*, J. Appl. Phys., vol. 99, no. 084506, May 2006). While various theories of operation may be applicable, in general the base material 340/440 employs narrower band gap material, and the interface with larger energy gap material depicted in FIGS. 3 and 4 occurs in a region containing a non-zero built-in electric field.

In general, the dimension of the wide band gap material 330/430 and barrier layer 425 should be as small as possible, while still providing a significant barrier to majority carrier injection into the base, and wide enough to encompass the region of enhanced space charge recombination. The total thickness of the narrower band gap base material 340/440 should be as large as possible to allow adequate photon absorption, while the position of the heterojunction between narrow and wide energy gap material is constrained by the need to avoid the region of enhanced space charge recombination and the need to position any abrupt heterointerface in a region of high built-in electric field. Given these constraints, the exact dimensions can be optimized for any given material system with basic experimentation clear to one of skill, including varying the thickness of the barrier layer 425 and the higher energy gap depletion region layer 330/430. An exemplary set of values for initiating such experimentation is 75 nm for the total high energy gap depletion region layer 330/430 thickness, and a thickness of 20 nm for the barrier 425. Note that these values are highly variable in various implementations. More generally, it is contemplated that the thickness values can range between approximately 10 and 400 nm for the energy gap depletion region layer 330/430 thickness and between approximately 5 and 200 nm for the barrier 425.

The illustrative depletion region 430 depicted in FIG. 4 is composed of two discrete layers. However, those skilled in the art will comprehend that the number of layers can be varied in alternate embodiments within the general parameters in which at least two different energy gap materials are employed in the construction of the device. Any number of layers can be used in the depletion region, of any absolute energy gap value, with the relative energy gaps typically conforming to the specifications given above (i.e. consists of a material with a higher energy gap than an energy gap of a material that defines the base) and more generally contemplated herein. It is also expressly contemplated that compositional grading between layers can provide benefits for both enhanced photo-generated carrier escape and enhancements in the built-in electric field. The use of materials forming type II heterointerfaces can also provide additional benefits to the material structure.

The illustrative material structure depicted in FIG. 4 shows an n-type emitter over a p-type base, with wide band gap material in the depletion region adjacent to the n-side suppressing electron injection. Those skilled in the art will readily recognize that an essentially equivalent design consists of a p-type emitter over a n-type base, with wide band gap material in the depletion region adjacent to the p-side suppressing hole injection. An alternate implementation, based upon the structures depicted in FIGS. 3 and 4 also includes a material structure with wide band gap barrier layers adjacent to either the p-side or the n-side or both.

Figure 5:
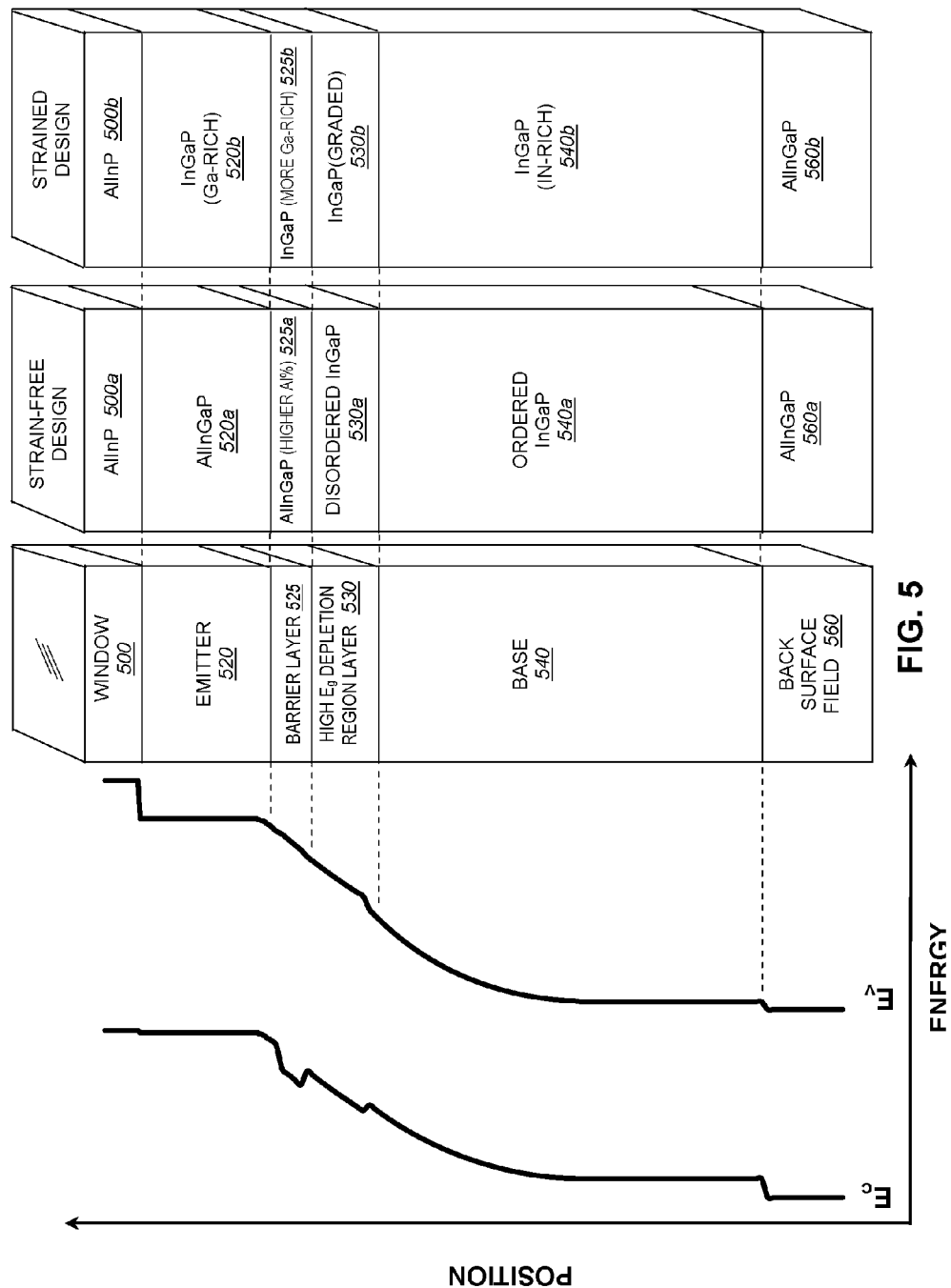
FIG. 5 is a diagram of the energy band versus position for a material structure of a semiconductor solar cell illustrating an extended heterojunction solar cell with a barrier layer using InGaP-based materials typically employed in the top subcell of III-V multijunction solar cells according to various embodiments.

The illustrative embodiments in FIG. 5 depict specific material structures for an extended heterojunction with barrier solar cell or subcell as applied to InGaP-based materials, which are often used for the top subcell in III-V multijunction solar cells. Three embodiments covered by respective top windows 500, 500a and 500b are depicted with respect to the associated graph of energy versus position (depth). By way of example, the following parameters can be employed in the first embodiment: an InGaP base layer 540 approximately 1000 nm in thickness positioned over a back surface 560. The base layer 540 contains an approximately 100 nm emitter 520 and a 200 nm energy gap depletion region layer with barrier layer 525/530. In this implementation of materials, the energy gap of the emitter 520 and within the depletion region 530 can be increased by adding Al to form AlInGaP alloys, increasing the Ga content in the InGaP, or forming a disordered InGaP alloy. Another illustrative embodiment, having window 500a, can be made strain-free relative to an underlying GaAs or Ge substrate, AlInGaP alloys are employed for both the emitter 520a and the higher energy gap depletion layer 530a, such that the barrier layer 525a contains material with higher Al compositions. In this embodiment, disordered InGaP is employed in the higher energy gap depletion region 530a adjoined to the base 540a, while the base 540a itself is composed of ordered InGaP, which has a lower energy gap. The base 540a is positioned over a back surface 560a. In another embodiment having window 500b, which can be made free of Al, Ga-rich InGaP is employed in the emitter 520b and barrier layer 525b. While this approach introduces lattice strain, the strain can be compensated by grading to a lower Ga-composition InGaP alloy through the high $E_g$ depletion region layer 530b and into the base 540b. The illustrative base 540b is positioned over a back surface 560b.

Figure 6:
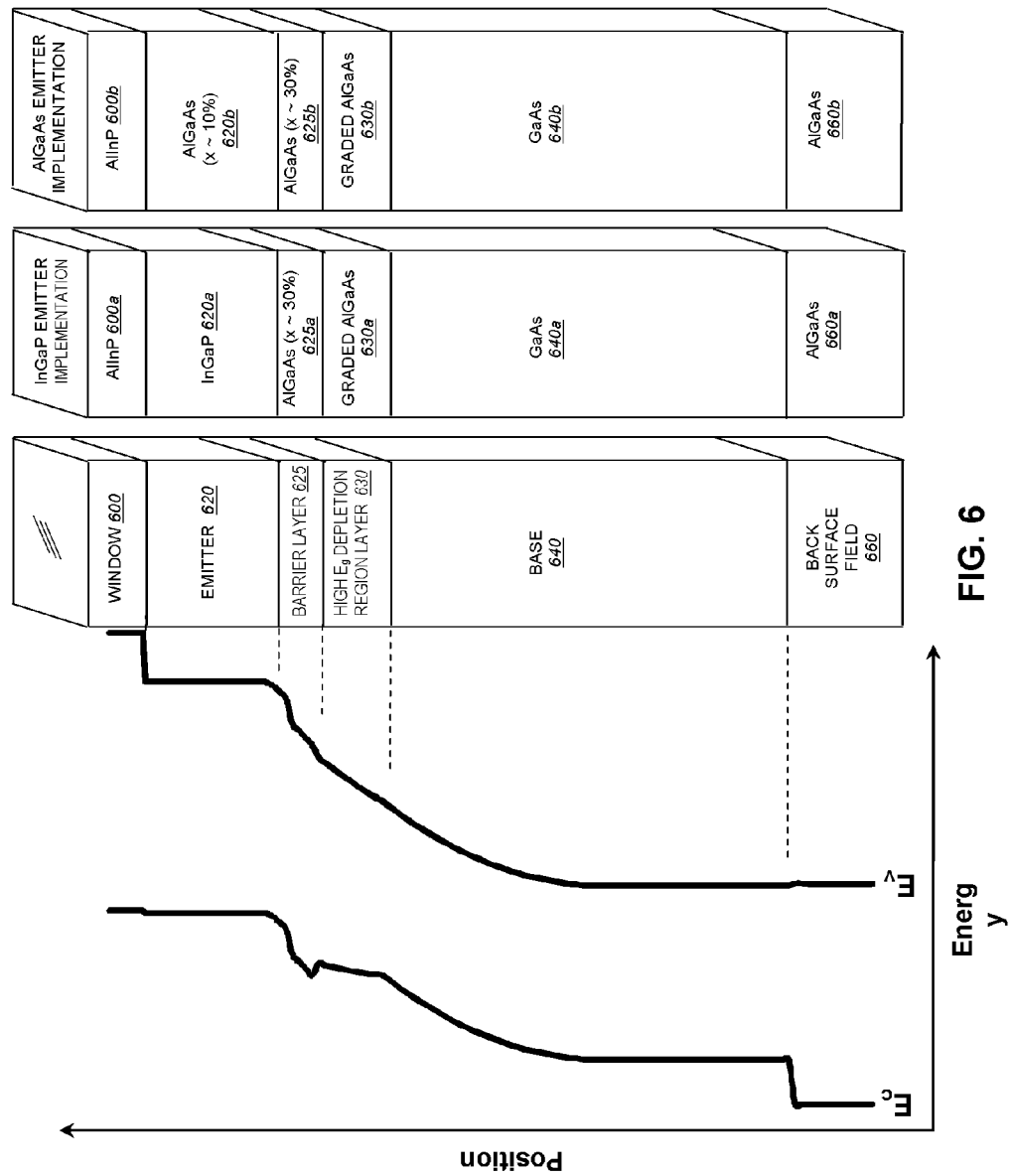
FIG. 6 is a diagram of the energy band versus position for a material structure of a semiconductor solar cell illustrating an extended heterojunction solar cell with a barrier layer using GaAs-based materials typically employed in the middle subcell of III-V multijunction solar cells according to various embodiments.

The illustrative embodiments in FIG. 6, each aligned with a common graph of energy versus position, depict specific material structures for an extended heterojunction with barrier solar cell or subcell as applied to GaAs materials, which are often used for the middle subcell in III-V multijunction solar cells. By way of example, the following parameters can be employed in the embodiment covered by window 600: a GaAs base layer 640 approximately 3000 nm in thickness, with an approximately 100 nm emitter 620 and a 200 nm energy gap depletion region layer with barrier layer 625/630. In this embodiment, the energy gap of the emitter 620 and within the depletion region 630 can be increased relative to the GaAs base 640 by employing InGaP or AlGaAs alloys. The back surface field layer 660 is shown, positioned opposite to the window 600. In a desirable configuration covered by window 600a, an InGaP lattice matched to GaAs is employed for the emitter 620a, while AlGaAs alloys are used for the higher energy gap depletion layer 630a, such that the barrier layer 625a contains material with higher Al compositions. A GaAs base 640a is provided in this embodiment. Compositionally graded AlGaAs alloys can be used to smooth the transition to GaAs within the depletion region. In an alternate embodiment covered by window 600b, AlGaAs alloys can also be employed in the emitter 620a. Layers 630b, 640b and 660b are similar to their respective counterparts 630a, 640a and 660a, described above.

Figure 7:
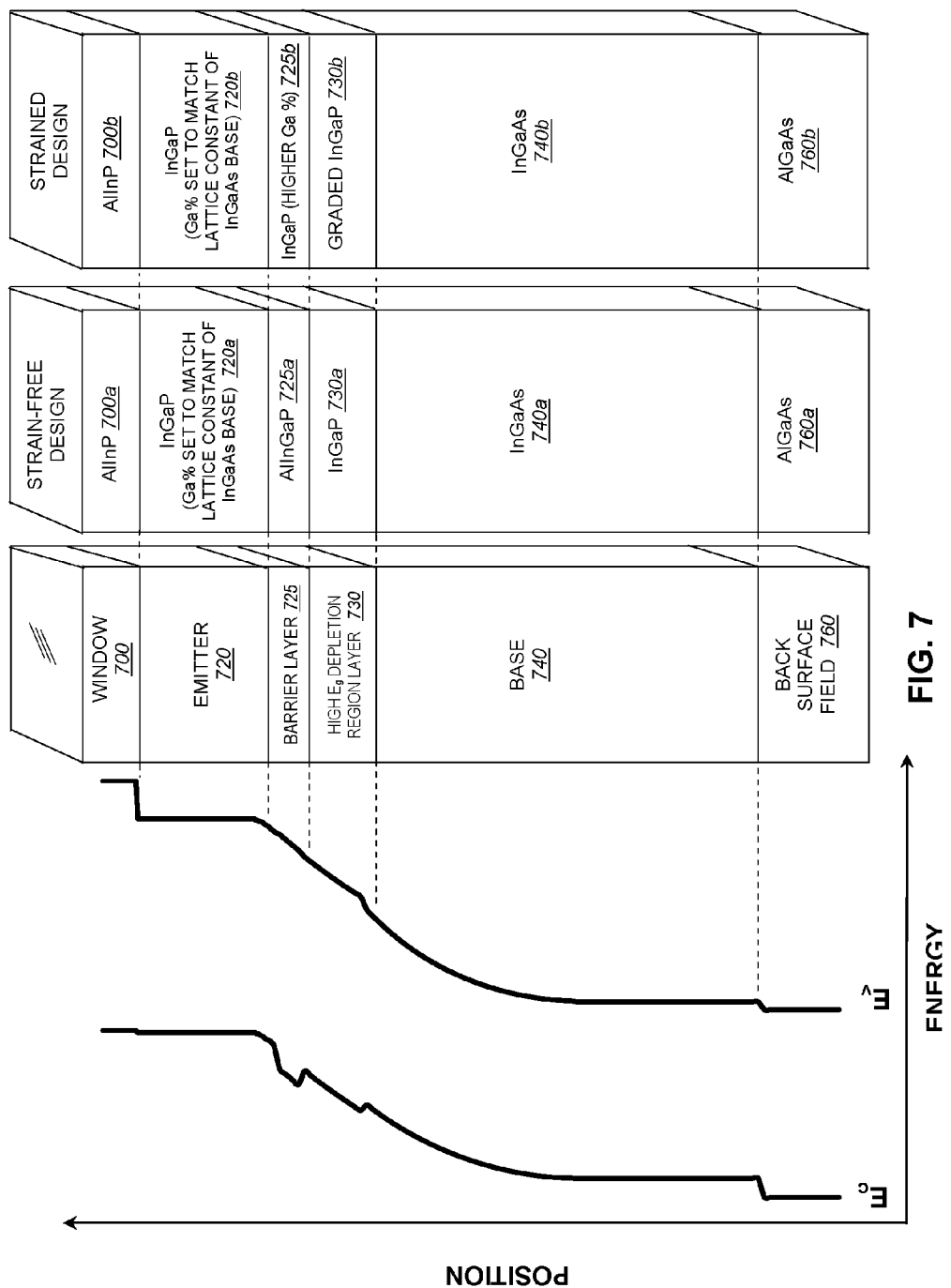
FIG. 7 is a diagram of the energy band versus position for a material structure of a semiconductor solar cell illustrating an extended heterojunction solar cell with a barrier layer using InGaAs-based materials typically employed in the lower subcell of III-V multijunction solar cells.

The illustrative embodiments in FIG. 7 depict specific material structures for an extended heterojunction with barrier solar cell or subcell as applied to InGaAs materials, which are often used for the lower subcell in III-V multijunction solar cells. These layers are described in conjunction with a common graph of energy versus position. Embodiments covered by respective windows 700, 700a and 700b are depicted in alignment with the energy band graph. In one embodiment, the following parameters can be employed: an InGaAs base layer 740 approximately 3000 nm in thickness, with an approximately 100 nm emitter 720 and a 200 nm energy gap depletion region layer with barrier layer 725/730. A back surface field 760 is provided opposite the window 700. When InGaAs alloys are used, the energy gap of the emitter 720 and within the depletion region 730 can be increased by employing InGaP alloys. In a further desirable configuration (covered by window 700a and including opposing layer 760a), InGaP lattice matched to the InGaAs base 740a is employed for the emitter 720a and higher energy gap depletion layer 730a, while lattice matched AlInGaP alloys are used the barrier layer 725a. In another alternate embodiment (having window 700b and opposing layer 760b), the barrier layer 725b contains material with higher Ga compositions, and is strained relative to the InGaAs base 740b. Other layers 720b, 730b are generally similar to those counterparts described above.

Undesired reflection of incident photons from the top surface of a single junction or multijunction solar cell can be minimized by the incorporation of transparent antireflection coating structures. These coating can be implemented in accordance with industry standard processes and materials in various embodiments. Antireflection coatings typically employ single or multiple layers of materials with index of refraction intermediate between the semiconductor and the media in which the incident photons are delivered (often air). Conventional single-layer antireflection coatings, although widely used, typically operate only at a single wavelength and at normal incidence. Graded-index coatings with variable-index profiles have been investigated for broadband antireflection properties, particularly with air as the ambient medium. For example, previous modeling work has suggested that a quintic-index profile is a near optimum profile for a graded-index antireflection coating (see, for example, U.S. Pat. No. 4,583,822, entitled QUINTIC REFRACTIVE INDEX PROFILE ANTIREFLECTION COATINGS, by W. H. Southwell, the teachings of which are expressly incorporated herein by reference as useful background information).

Oblique-angle deposition has recently been demonstrated as an effective technique for tailoring the refractive index of a variety of thin film materials (see for example, by way of useful background, J.-Q. Xi, M. F. Schubert, J. K. Kim, E. F. Schubert, M. Chen, S.-Y. Lin, W. Liu, and J. A. Smart, *Optical Thin-Film Materials with Low Refractive Index for Broad-Band Elimination of Fresnel Reflection*, Nat. Photon., vol. 1, pp. 176-179, 2007). Oblique-angle deposition is a method of growing nanostructured, porous thin films, and hence thin films with low-refractive index (low-n), enabled by surface diffusion and self-shadowing effects during the deposition process. Both conducting and non-conducting graded-index antireflection coatings that are broadband and Omni-directional have been demonstrated using this deposition technique. As taught by Cho et al. in U.S. Pat. No. 7,483,212, both oblique angle deposition and co-sputtering are material synthesis techniques that can be used to construct multiple layer, graded refractive index coatings to minimize reflection losses. The teachings of this patent are expressly incorporated herein by reference as useful background information. It is contemplated in illustrative embodiments that these processes can be adapted to minimize reflection losses in epitaxial III-V single- and multi-junction solar cells.

Figure 8:
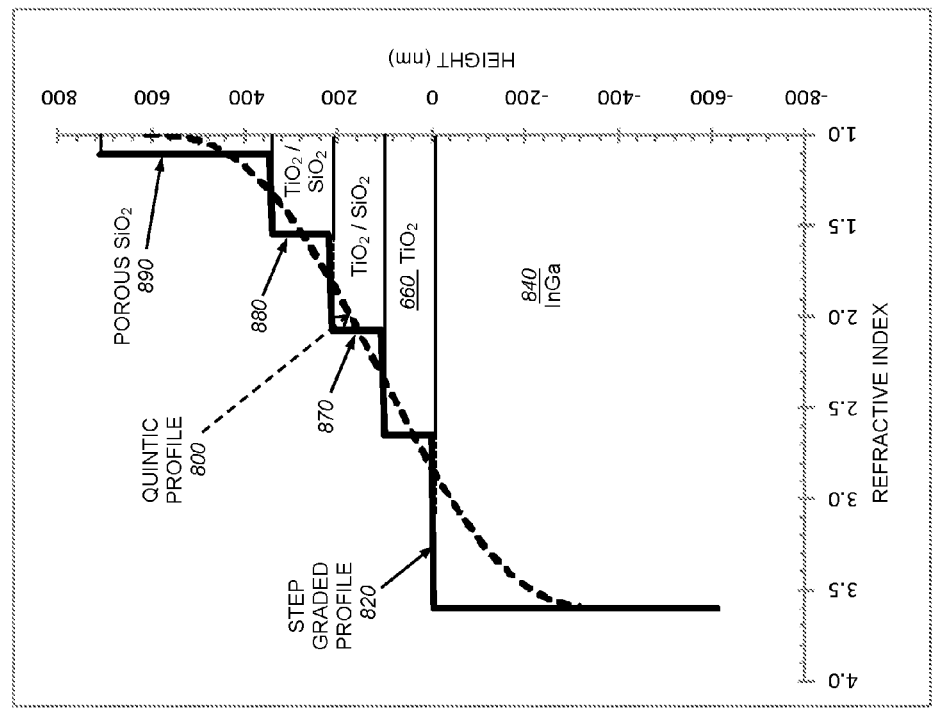
FIG. 8 is a graph showing index of refraction versus position for a step-graded antireflection coating on a top InGaP subcell, in accordance with illustrative embodiments, to enhance optical transmission into the active regions of the underlying III-V multijunction solar cell.

FIG. 8 depicts a desirable antireflection coating for a III-V multijunction solar cell. In particular, the index of refraction (n) should be varied from that of the InGaP 840 used in the base layer of the top subcell (approximately 3.6) to that of air (e.g. near 1). A continuously varying quintic profile 800 of the index of refraction, such as that taught in U.S. Pat. No. 4,583,822, can be approximated by a step graded profile 820. In the design shown in FIG. 8, the index of refraction is varied from 3.6 to 1.1 over four discrete steps, which can consist of 100 nm of $TiO_2$ 860 (n~2.65), 120 nm of $TiO_2$/ $SiO_2$ 870 (n~2.05), 125 nm of $TiO_2$/$SiO_2$ 880 (n~1.55), and 365 nm of porous $SiO_2$ 890 (n~1.1).

One deficiency of the graded refractive index (GRIN) antireflection structure shown in FIG. 8 is the large index of refraction step between $TiO_2$ 860 (n~2.65) and InGaP 840 (n~3.6). The multilayered structure in FIG. 9 addresses this deficiency by employing epitaxial semiconductor layers between the InGaP and the $TiO_2$. In particular, the index of refraction in varied from 3.6 to 1.1 over six steps in a graded profile 920 to approximate a quintic profile 900, with approximately 70 nm of AlInGaP 945 (n~3.3), 90 nm of AlInP 955 (n~3.0), 100 nm of $TiO_2$ 960 (n~2.65), 120 nm of $TiO_2$/$SiO_2$ 970 (n~2.05), 125 nm of $TiO_2$/$SiO_2$ 980 (n~1.55), and 365 nm of porous $SiO_2$ 990 (n~1.1).

Figure 9:
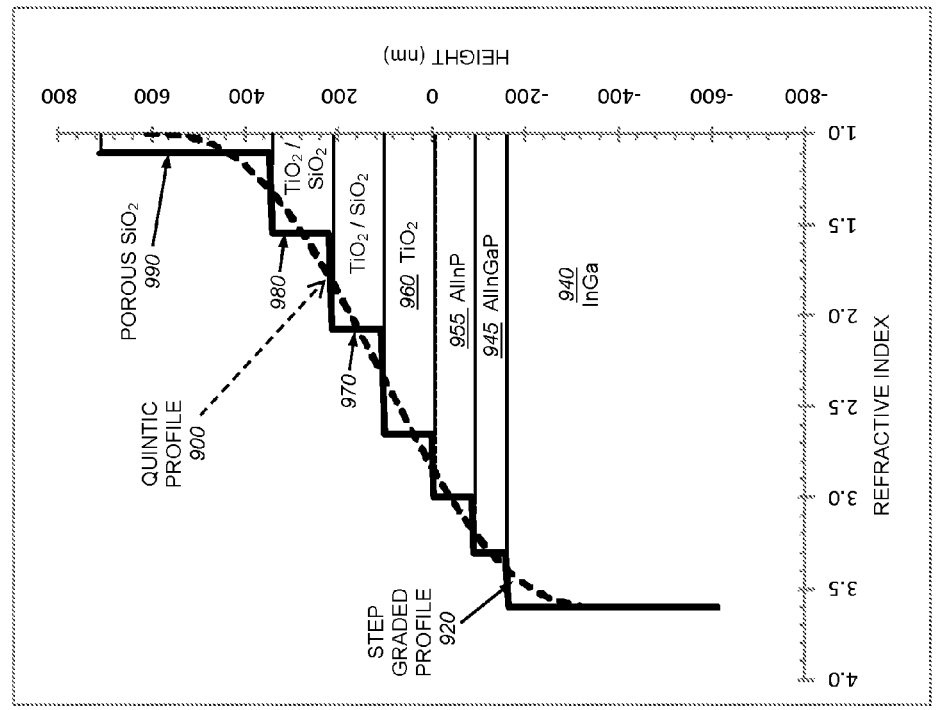
FIG. 9 is a graph showing index of refraction versus position for a step-graded antireflection coating on a top InGaP subcell, in accordance with another illustrative embodiment in which epitaxial material is also employed in the step-graded antireflection structure.

The illustrative antireflection structures depicted in FIGS. 8 and 9 show particular combinations of layer thicknesses and index of refractions. However, those skilled in the art will comprehend that essentially equivalent designs consist of structures with any number of layers, and with a range of individual layer thicknesses and index of refractions. In particular, the novel use of epitaxial semiconductor layers to grade the index of refraction from the top subcell to the non-epitaxial optical material layers (e.g. $TiO_2$ or $SiO_2$), in illustrative embodiments, provides effective performance. It should be further noted that epitaxial semiconductor layers such as AlInGaP and AlInP can be designed to simultaneously function as window and contact layers in III-V single- or multi-junction photovoltaic devices.

Figure 10:
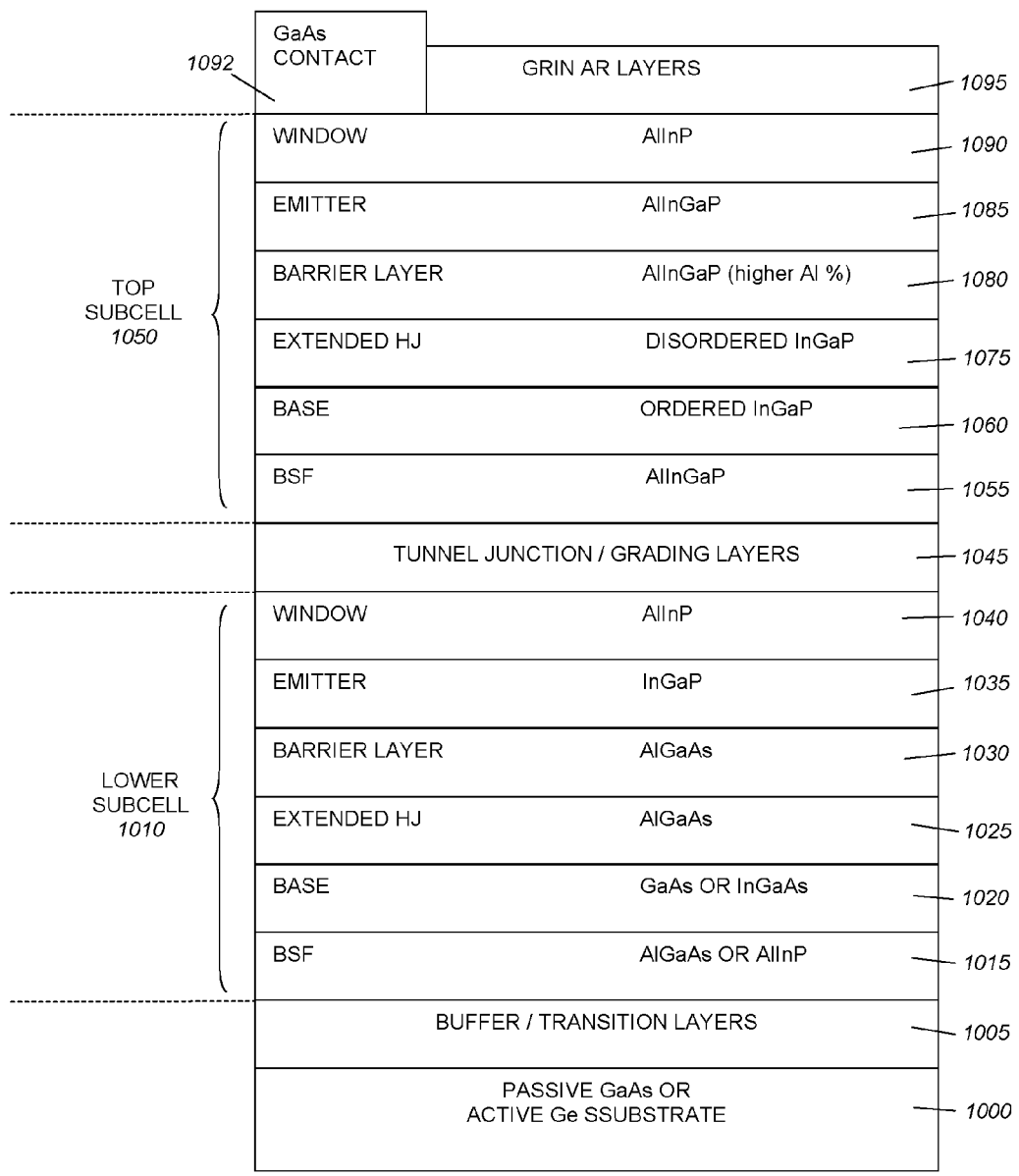
FIG. 10 is a schematic side cross section of a multijunction solar cell device according to an illustrative embodiment incorporating extended heterojunctions in both the top and lower epitaxial subcells as well as a step-graded anti-reflection coating.

FIG. 10 is a cross sectional view illustrating a multijunction solar cell with two epitaxial subcells incorporating the previously described design elements for enhancing both the voltage and current output of the device. Fabrication of this device begins by placing a commercially available Ge or GaAs substrate 1000 into a standard III-V semiconductor deposition tool, such as a metal organic chemical vapor deposition (MOCVD) system available (for example) from Aixtron AG of Germany or Veeco Instruments of Plainview, N.Y. After then depositing a suitable buffer and/or transition layers 1005 on the substrate, a lower subcell 1010 is formed, followed by tunnel junction 1045 and, as required, grading layers, followed by a top subcell 1050, and finally suitable contact layers 1092. The top subcell 1050 consists of an AlInP window 1090 and an AlInGaP emitter 1080. In a desirable embodiment, the thickness and index of refraction of these top AlInP and AlInGaP layers are designed to also function as part of the antireflection structure as illustratively depicted in FIG. 9. Higher energy gap material may be incorporated into the depletion region of the top subcell 1050, and in particular, AlInGaP in the barrier layer 1080 and disordered InGaP as the remaining extended heterojunction layer 1075. An ordered InGaP base layer 1060 and AlInGaP back surface field (BSF) 1055 are employed in the top subcell 1050 of the example shown in FIG. 10. The lower subcell 1010 consists of an AlInP window 1040 and an InGaP emitter 1035. AlGaAs alloys are then used for the barrier layer 1030 and extended heterojunction 1025 as in FIG. 6. Either GaAs or InGaAs can be employed in the base layer, depending on the substrate and nature of the overall structure (e.g. lattice matched to the substrate or metamorphic). After the epitaxial deposition step, a photovoltaic device is formed via standard semiconductor processes to create top and bottom metal contacts, and unwanted epitaxial top contact material 1092 is selectively removed. As a final manufacturing step, optical thin film coatings are deposited via physical deposition methods such as co-sputtering and oblique angle deposition. The thickness and index properties of these coatings in a desirable embodiment follow the design depicted in FIGS. 8 and 9.

Figure 11:
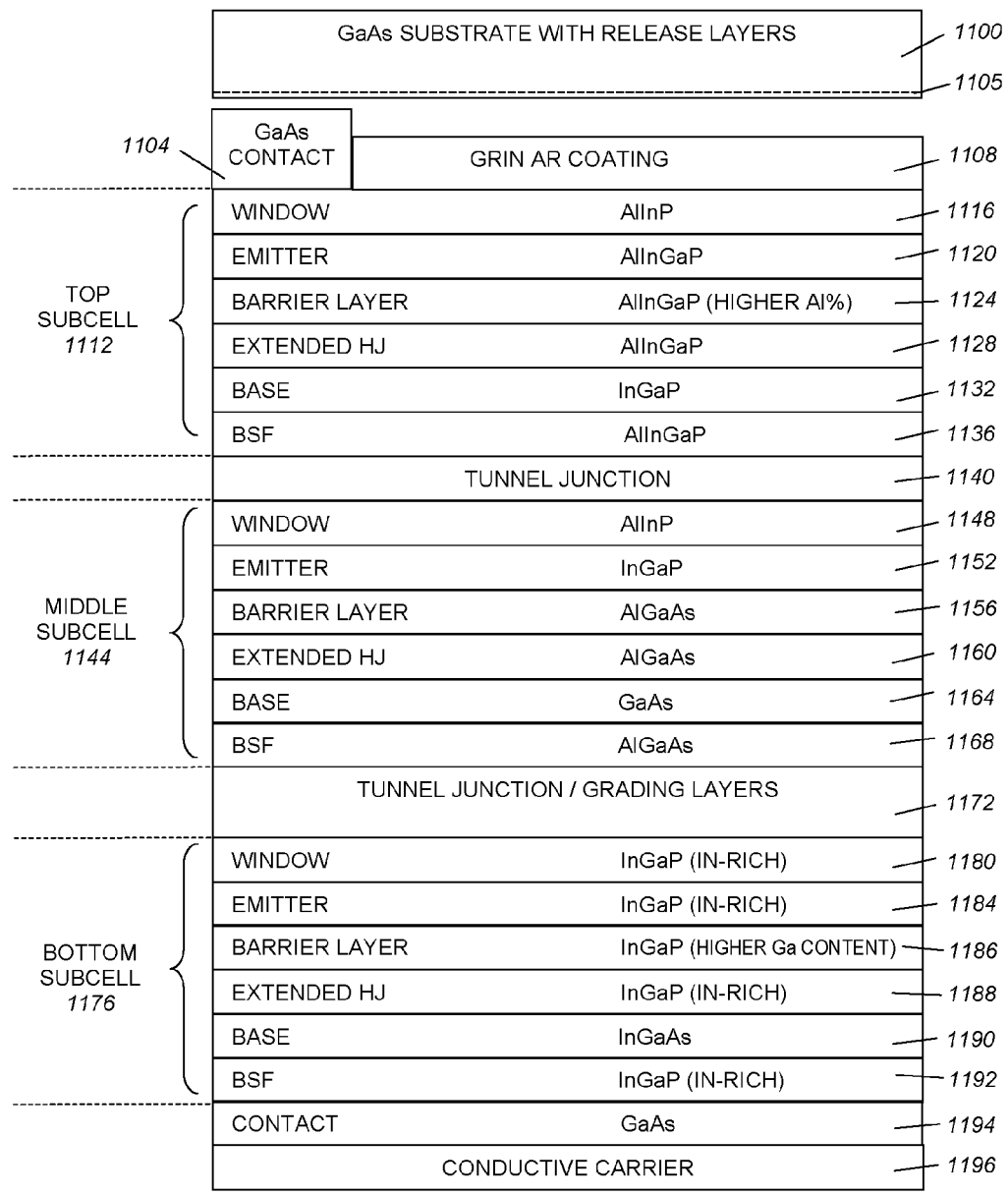
FIG. 11 is a schematic side cross section of an inverted multijunction solar cell device according to an illustrative embodiment with a top, middle, and bottom subcell incorporating extended heterojunctions and a step-graded antireflection coating.

FIG. 11 is a cross sectional view illustrating a multijunction solar cell with three epitaxial subcells incorporating the previously described design elements for enhancing both the voltage and current output of the device. Fabrication of this device begins by placing a commercially available GaAs substrate 1100 into a standard III-V semiconductor deposition tool (MOCVD or MBE). After then depositing suitable buffer and release layers 1105 on the substrate, the cell is grown in an inverted fashion by first forming a top subcell 1112, followed by tunnel junction 1140 and, as required, grading layers, followed by a middle subcell 1144, another tunnel junction and grading layers 1172, a lower subcell 1176, and finally suitable contact layers 1194. The top subcell 1112 can consist of an AlInP window 1116 and an AlInGaP emitter 1120. In an exemplary implementation, the thickness and index of refraction of these top AlInP and AlInGaP layers are designed to also function as part of the antireflection structure as illustratively depicted in FIG. 9. Higher energy gap material may be incorporated into the depletion region of the top subcell 1112, and in particular, AlInGaP alloys in the barrier layer 1124 and extended heterojunction layer 1128. An InGaP base layer 1132 and AlInGaP back surface field 1136 are employed in the top subcell 1112 of the example shown in FIG. 11. The middle subcell 1144 consists of an AlInP window 1148 and an InGaP emitter 1152. AlGaAs alloys are then used for the barrier layer 1156 and extended heterojunction 1160. GaAs is employed in the base layer 1164, and AlGaAs as the back surface field 1168. The lower subcell 1176 consists of an InGaP window 1180, emitter 1184, barrier layer 1186, extended heterojunction layer 1188, and back surface field 1192. The energy gap can be varied by changing the Ga composition of the InGaP alloy. In a typical inverted metamorphic structure (see for example, Wanlass, US Published Application No. 2006/014435), the InGaP emitter composition is In-rich to match the lattice constant of the InGaAs base 1190. In the improved inverted metamorphic structure shown in FIG. 11, higher energy gap InGaP is formed in the depletion region by increasing the Ga content. After the epitaxial deposition step, a conductive carrier 1196 is attached to the epitaxial layer stack and the substrate with release layers 1100 removed. A photovoltaic device is then formed via standard semiconductor processes to create top and bottom metal contacts and selectively remove unwanted epitaxial top contact material 1104. As a potential completion step in the solar cell manufacturing process, optical thin film coatings can be deposited via physical deposition such as co-sputtering and oblique angle deposition (and/or other conventional techniques). The thickness and index properties of these coatings in an exemplary embodiment follow the design depicted in FIGS. 8 and 9.

The many features and advantages of the illustrative embodiments described herein are apparent from the above written description and thus it is intended by the appended claims to cover all such features and advantages of the invention. Further, because numerous modifications and changes will readily occur to those skilled in the art, it is not desired to limit the invention to the exact construction and operation as illustrated and described. For example, the illustrative embodiments can include additional layers to perform further functions or enhance existing, described functions. Likewise, while not shown, the electrical connectivity of the cell structure with other cells in an array and/or an external conduit is expressly contemplated and highly variable within ordinary skill. More generally, while some ranges of layer thickness and illustrative materials are described herein. It is expressly contemplated that additional layers, layers having differing thicknesses and/or material choices can be provided to achieve the functional advantages described herein. In addition, directional and locational terms such as "top", "bottom", "center", "above" and "below" should be taken as relative conventions only, and not as absolute. Accordingly, this description is to be taken only by way of example and not to otherwise limit the scope of the invention.

What is claimed is:

1. A solar cell device comprising:

a subcell-based structure that includes a topmost subcell; and a broadband, step-graded antireflection structure located above the topmost subcell, the antireflection structure comprising a plurality of deposited layers of discrete materials comprising:

a layer of approximately 70 nm of AlInGaP having an index of refraction of approximately 3.3, a layer of approximately 90 nm of AlInP having an index of refraction of approximately 3.0, a layer of approximately 100 nm of $TiO_2$ having an index of refraction of approximately 2.65, a layer of approximately 120 nm of $TiO_2$ and $SiO_2$ having an index of refraction of approximately 2.05, a layer of approximately 125 nm of $TiO_2$ and $SiO_2$ having an index of refraction of approximately 1.55, and a layer of approximately 365 nm of porous $SiO_2$ having an index of refraction of approximately 1.1.

* * * * *